(12) United States Patent
Deng et al.

(10) Patent No.: US 11,346,887 B2
(45) Date of Patent: May 31, 2022

(54) METHOD AND APPARATUS FOR CALCULATING SOH OF BATTERY POWER PACK, AND ELECTRIC VEHICLE

(71) Applicant: BYD COMPANY LIMITED, Guangdong (CN)

(72) Inventors: Linwang Deng, Shenzhen (CN); Tianyu Feng, Shenzhen (CN); Chun Lv, Shenzhen (CN); Siqi Lin, Shenzhen (CN); Zihua Yang, Shenzhen (CN)

(73) Assignee: BYD Company Limited, Shenzhen (CN)

( * ) Notice: Subject to any disclaimer, the term of this patent is extended or adjusted under 35 U.S.C. 154(b) by 0 days.

(21) Appl. No.: 17/042,781

(22) PCT Filed: Mar. 25, 2019

(86) PCT No.: PCT/CN2019/079448
§ 371 (c)(1),
(2) Date: Sep. 28, 2020

(87) PCT Pub. No.: WO2019/184843
PCT Pub. Date: Oct. 3, 2019

(65) Prior Publication Data
US 2021/0018568 A1 Jan. 21, 2021

(30) Foreign Application Priority Data
Mar. 30, 2018 (CN) .......................... 201810279422.5

(51) Int. Cl.
*G01R 31/36* (2020.01)
*B60L 58/16* (2019.01)

(52) U.S. Cl.
CPC .......... *G01R 31/3648* (2013.01); *B60L 58/16* (2019.02); *B60L 2240/547* (2013.01); *B60L 2240/549* (2013.01); *B60L 2260/54* (2013.01)

(58) Field of Classification Search
CPC .. G01R 31/392; G01R 31/36; G01R 31/3648; B60L 58/16; B60L 2240/547;
(Continued)

(56) References Cited

U.S. PATENT DOCUMENTS 8,680,815 B2 3/2014 Wang et al.
9,255,971 B2 * 2/2016 Hu ....................... G01R 31/367
(Continued)

FOREIGN PATENT DOCUMENTS

CN 102565710 A 7/2012
CN 102590754 A 7/2012
(Continued)

OTHER PUBLICATIONS

PCT International Search Report, PCT/CN2019/079448, dated Jun. 28, 2019, 4 Pages.

*Primary Examiner* — Tung S Lau
(74) *Attorney, Agent, or Firm* — Fenwick & West LLP

(57) ABSTRACT

Provided is a method for calculating the SOH of a battery power pack. The method comprises the following steps: acquiring a charging curve of a cell of a battery power pack, and determining a current charging phase according to the charging curve, wherein the charging phase comprises a high voltage charging inflection point and a high voltage charging phase (S1); acquiring a battery pack power amount corresponding to the high voltage charging inflection point and a battery pack power amount corresponding to the high voltage charging phase (S2); calculating the remaining capacity of a cell according to the battery pack power amount corresponding to the high voltage charging inflection point and the battery pack power amount corresponding to the high voltage charging phase (S3); and calculating the SOH of the cell according to the remaining capacity (S4).

12 Claims, 2 Drawing Sheets

(58) Field of Classification Search
CPC ........... B60L 2240/549; B60L 2260/54; B60L 2240/545; H02J 7/005; Y02T 10/70
See application file for complete search history.

(56) References Cited

U.S. PATENT DOCUMENTS

| | | |
|---|---|---|
| 9,411,019 B2 | 8/2016 | Hwang et al. |
| 10,168,390 B2 | 1/2019 | Sung |
| 10,620,273 B2* | 4/2020 | Tang .................. G01R 31/3648 |
| 2012/0105069 A1 | 5/2012 | Wang et al. |
| 2015/0070024 A1* | 3/2015 | Kim ..................... H01M 10/48 |
| | | 324/430 |
| 2015/0168498 A1 | 6/2015 | Hwang et al. |
| 2017/0115355 A1* | 4/2017 | Willard ................ G01R 31/392 |
| 2017/0212203 A1 | 7/2017 | Young et al. |
| 2018/0031642 A1 | 2/2018 | Sung |
| 2018/0143262 A1* | 5/2018 | Kondo ................ G01R 31/392 |
| 2018/0328995 A1* | 11/2018 | Kondo ................ G01R 31/392 |

FOREIGN PATENT DOCUMENTS

| | | |
|---|---|---|
| CN | 106569143 A | 4/2017 |
| CN | 106696712 A | 5/2017 |
| KR | 20160063070 A | 6/2016 |

\* cited by examiner

METHOD AND APPARATUS FOR CALCULATING SOH OF BATTERY POWER PACK, AND ELECTRIC VEHICLE

CROSS-REFERENCE TO RELATED APPLICATIONS

This application is the National Stage of International Application No. PCT/CN2019/079448, "Method and Apparatus for Calculating SOH of Battery Power Pack, and Electric Vehicle," filed on Mar. 25, 2019; which claims priority to Chinese patent application No. 201810279422.5 filed on Mar. 30, 2018. The entire content of both of the above-referenced applications is incorporated herein by reference.

FIELD

This application relates to the technical field of power batteries, and in particular, to a method for calculating an SOH of a power battery pack, an apparatus for calculating an SOH of a power battery pack, and an electric vehicle.

BACKGROUND

Electric vehicles enter the stage of social development under dual pressure of energy and environment. As an energy reserve source of the electric vehicle, a power battery pack directly determines an endurance mileage of the electric vehicle. Therefore, monitoring and estimating a health status of a power battery pack of an electric vehicle by a battery management system (BMS) is a long-term and important research.

A state of health (SOH) of a battery refers to a health status of a battery, and more often, is prediction of a life of a battery pack. Currently, estimation of the SOH mainly depends on estimation of a state of charge (SOC), and the estimation of the SOC depends on amounts of electricity charged into and discharged from the battery pack. Currently, the electricity amounts are mainly calculated by using an ampere-hour integral method. The ampere-hour integral method requires a very accurate initial value of a batter. In addition, as time goes by, errors of measured currents accumulate, resulting in inaccurate electricity amount estimation and inaccurate SOH estimation.

SUMMARY

This application is intended to resolve at least one of the technical problems in the related art to some extent. To this end, a first purpose of this application is to propose a method for calculating an SOH of a power battery pack, so that convenience and accuracy of estimating the SOH of the power battery pack can be greatly improved.

A second purpose of this application is to further propose an apparatus for calculating an SOH of a power battery pack.

A third purpose of this application is to further propose an electric vehicle.

An embodiment of a first aspect of this application proposes a method for calculating an SOH of a power battery pack, including the following steps: obtaining a charging curve of a cell of the power battery pack, and determining a current charging stage according to the charging curve, where the charging stage includes a high-voltage charging turning point and a high-voltage platform charging stage; obtaining a battery pack level corresponding to the high-voltage charging turning point and a battery pack level corresponding to the high-voltage platform charging stage; calculating a remaining capacity of the cell according to the battery pack level corresponding to the high-voltage charging turning point and the battery pack level corresponding to the high-voltage platform charging stage; and calculating an SOH of the cell according to the remaining capacity.

According to the method for calculating an SOH of a power battery pack according to this embodiment of this application, the charging curve of the cell of the power battery pack is obtained and the current charging stage is determined, the battery pack level corresponding to the high-voltage charging turning point and the battery pack level corresponding to the high-voltage platform charging stage are obtained, the remaining capacity of the cell is calculated according to the battery pack level corresponding to the high-voltage charging turning point and the battery pack level corresponding to the high-voltage platform charging stage, and the SOH of the cell is calculated according to the remaining capacity. Therefore, the method does not require a cycle of full charging and full discharging, is free of impact of operating conditions of an electric vehicle, does not depend on an initial value of an SOC, and avoids accumulative errors caused by integrals, thereby greatly improving the convenience and the accuracy of estimating the SOH of the power battery pack.

An embodiment of a second aspect of this application proposes an apparatus for calculating an SOH of a power battery pack, the apparatus including: a first obtaining module configured to obtain a charging curve of a cell of the power battery pack, and determine a current charging stage according to the charging curve, where the charging stage includes a high-voltage charging turning point and a high-voltage platform charging stage; a second obtaining module configured to obtain a battery pack level corresponding to the high-voltage charging turning point and a battery pack level corresponding to the high-voltage platform charging stage; and a calculating module configured to calculate a remaining capacity of the cell according to the battery pack level corresponding to the high-voltage charging turning point and the battery pack level corresponding to the high-voltage platform charging stage, and calculate an SOH of the cell according to the remaining capacity.

According to the apparatus for calculating an SOH of a power battery pack according to this embodiment of this application, the first obtaining module obtains the charging curve of the cell of the power battery pack and determines the current charging stage, the second obtaining module obtains the battery pack level corresponding to the high-voltage charging turning point and the battery pack level corresponding to the high-voltage platform charging stage, and the calculating module calculates the remaining capacity of the cell according to the battery pack level corresponding to the high-voltage charging turning point and the battery pack level corresponding to the high-voltage platform charging stage, and calculates the SOH of the cell according to the remaining capacity. Therefore, the apparatus does not require a cycle of full charging and full discharging, is free of impact of operating conditions of an electric vehicle, does not depend on an initial value of an SOC, and avoids accumulative errors caused by integrals, thereby greatly improving the convenience and the accuracy of estimating the SOH of the power battery pack.

An embodiment of a third aspect of this application proposes an electric vehicle, including the apparatus for calculating an SOH of a power battery pack according to the embodiment of the second aspect of this application.

According to the electric vehicle of this embodiment of this application, convenience and accuracy of estimating the SOH of the power battery pack can be greatly improved.

Other aspects and advantages of this application will be given in the following description, some of which will become apparent from the following description or may be learned from practices of this application.

DETAILED DESCRIPTION

Embodiments of this application are described below in detail. Examples of the embodiments are shown in the accompanying drawings, and same or similar reference signs in all the accompanying drawings indicate same or similar components or components having same or similar functions. The embodiments described below with reference to the accompanying drawings are exemplary, and are intended to explain this application and cannot be construed as a limitation to this application.

A method and an apparatus for calculating an SOH of a power battery pack, and an electric vehicle according to the embodiments of this application are described below with reference to the drawings.

The electric vehicle in this embodiment of this application may be a pure electric vehicle or a hybrid vehicle. A power battery pack thereof includes a plurality of cells connected in series. During charging or discharging of the power battery pack, correspondingly, the plurality of cells may be simultaneously charged or discharged.

Figure 1:
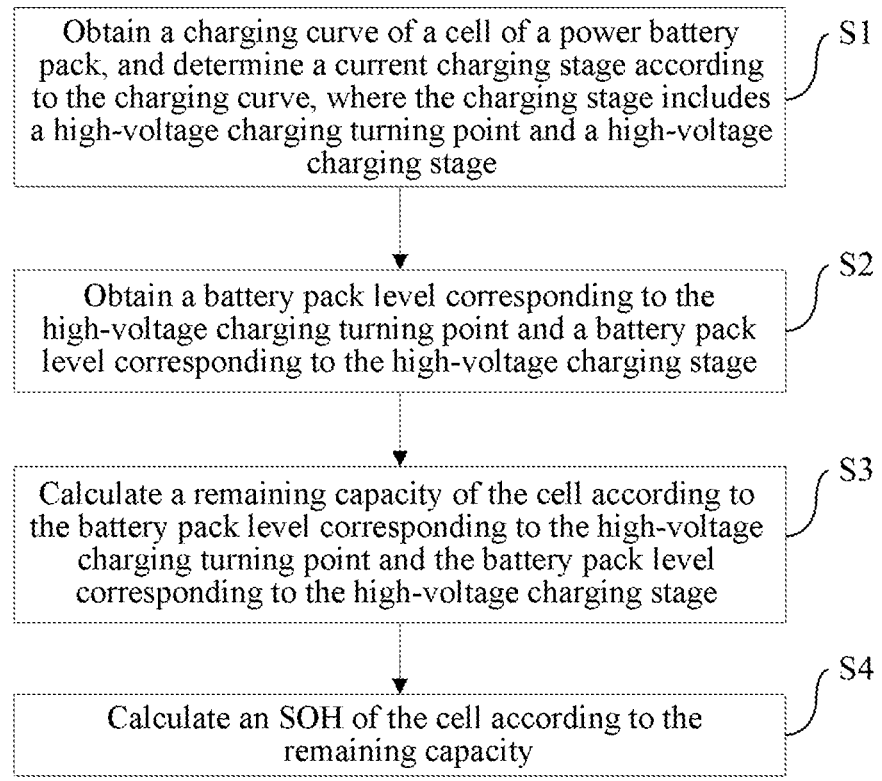
FIG. 1 is a flowchart of a method for calculating an SOH of a power battery pack according to an embodiment of this application.

FIG. 1 is a flowchart of a method for calculating an SOH of a power battery pack according to an embodiment of this application.

As shown in FIG. 1, the method for calculating an SOH of a power battery pack in this embodiment of this application includes the following steps.

S1: Obtain a charging curve of a cell of the power battery pack, and determine a current charging stage according to the charging curve, where the charging stage includes a high-voltage charging turning point and a high-voltage platform charging stage.

In an embodiment of this application, the power battery pack may be a lithium-ion battery. An initial SOC of the power battery pack is less than 20%, for example, 5%. A charging mode of the power battery pack may be a constant current charging mode, and a charging rate is less than 1 C. During charging of the power battery pack under the above conditions, a BMS may collect and record parameters such as a total voltage and a total current of the power battery pack, a voltage and a temperature of a cell, and current charging duration, etc. A BMS charging algorithm may be enabled to obtain a charging curve of each cell in the power battery pack, that is, a relationship curve between a voltage V and a capacity Ah.

The determining a current charging stage according to the charging curve includes: performing smooth filtering on the charging curve, and obtaining a voltage of the cell; and determining whether a change rate of the voltage of the cell between adjacent moments is a peak value exceeding a preset threshold, and when the change rate of the voltage of the cell between the adjacent moments is the peak value exceeding the preset threshold, using, as the high-voltage charging turning point of the cell, a point corresponding to the change rate of the voltage as the peak value.

Figure 2:
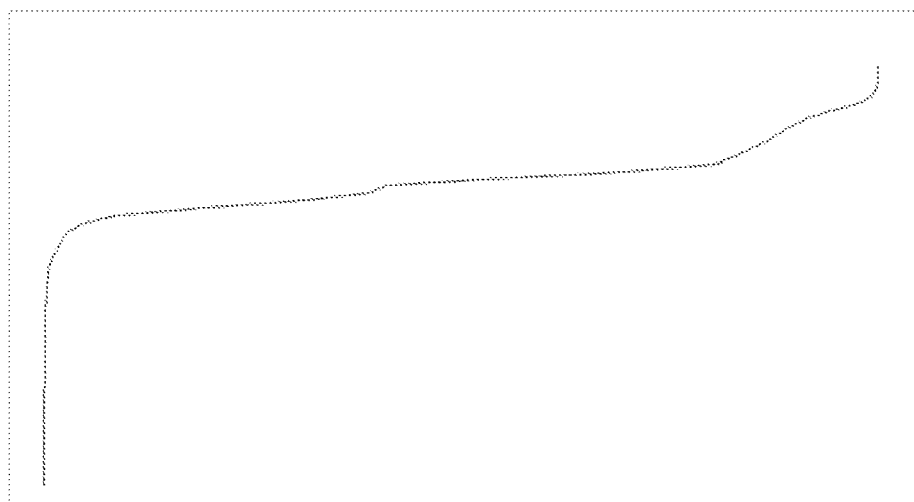
FIG. 2 is a schematic diagram of a charging curve of a cell according to an embodiment of this application.
Figure 3:
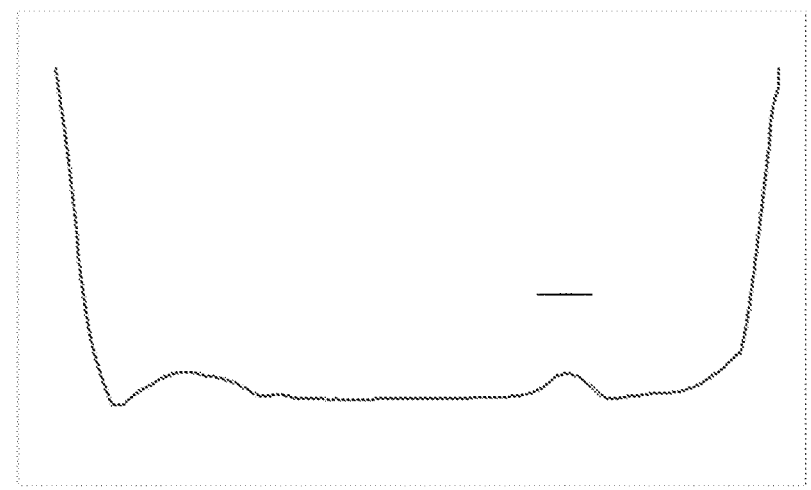
FIG. 3 is a schematic diagram of a derivative curve of a charging curve according to an embodiment of this application.

It may be understood that the charging curve of the cell may be calculated to obtain a voltage change rate between a next moment and a previous moment. In an embodiment of this application, an initial stage of the charging curve may be referred to as a low-voltage platform charging stage. When the BMS charging algorithm detects a last curve turning point whose peak value is positive, the turning point is referred to as a low-voltage charging turning point $V_{LVTP}$, and then a middle-voltage platform (MVP) charging stage is enabled. When the change rate of the voltage of the cell between the adjacent moments is the peak value exceeding the preset threshold, the charging stage reaches the high-voltage charging turning point $V_{HVTP}$, and then enters the high-voltage platform (HVP) charging stage. In an embodiment of this application, a charging curve of a specific cell may be shown in FIG. 2, and a derivative curve thereof may be shown in FIG. 3.

In an embodiment of this application, it may be further determined according to an SOC and the voltage of the cell whether the high-voltage charging turning point is reached. If the change rate of the voltage of the cell between the adjacent moments is the peak value exceeding the preset threshold, and the SOC of the cell is less than a preset SOC value and/or the voltage of the cell is less than a preset voltage value, the point is used as the high-voltage charging turning point of the cell.

S2: Obtain a battery pack level corresponding to the high-voltage charging turning point and a battery pack level corresponding to the high-voltage platform charging stage.

S3: Calculate a remaining capacity of the cell according to the battery pack level corresponding to the high-voltage charging turning point and the battery pack level corresponding to the high-voltage platform charging stage.

In an embodiment of this application, the remaining capacity of the cell may be calculated according to the following formula:

$$Q' = Q_{HVTP} + Q_{HVP}, \text{ where}$$

$Q_{HVTP}$ is the battery pack level corresponding to the high-voltage charging turning point, and $Q_{HVP}$ is the battery pack level corresponding to the high-voltage platform charging stage.

S4: Calculate an SOH of the cell according to the remaining capacity.

In order to eliminate random errors, that is, battery level estimation errors caused by random reasons such as a temperature error, a current error, or a system algorithm error, etc., n previous calculated remaining capacities of the cell may be obtained, a final remaining capacity of the cell is obtained according to the n calculated remaining capacities of the cell, and the SOH of the cell is calculated according to the final remaining capacity.

The final remaining capacity of the cell may be calculated according to the following formula:

$$Q_N = n_1 Q' + n_2 Q'' + \ldots + n_n Q^{n'}, \text{ where}$$

$Q_N$ is the final remaining capacity of the cell; and $n_1$-$n_n$ are weight parameters corresponding to the n calculated remaining capacities of the cell, and $Q'$-$Q'''$ are the n calculated remaining capacities of the cell, where $n_1 + n_2 + \ldots n_n = 1$. Specific values of $n_1$-$n_n$ may be assigned in combination with historical data and a current operating condition of the power battery pack.

After the final remaining capacity $Q_N$ of the cell is calculated, the SOH of the cell may be calculated according to the following formula:

$$SOH = \frac{Q_N}{Q_0} * 100\%,$$

where $Q_0$ is an ex-factory nominal capacity of the cell.

Since the power battery pack is composed of cells, obtaining the SOH of the cell means obtaining the SOH of the power battery pack.

According to the method for calculating an SOH of a power battery pack according to this embodiment of this application, the charging curve of the cell of the power battery pack is obtained and the current charging stage is determined, the battery pack level corresponding to the high-voltage charging turning point and the battery pack level corresponding to the high-voltage platform charging stage are obtained, the remaining capacity of the cell is calculated according to the battery pack level corresponding to the high-voltage charging turning point and the battery pack level corresponding to the high-voltage platform charging stage, and the SOH of the cell is calculated according to the remaining capacity. Therefore, the method does not require a cycle of full charging and full discharging, is free of impact of operating conditions of an electric vehicle, does not depend on an initial value of an SOC, and avoids accumulative errors caused by integrals, thereby greatly improving the convenience and the accuracy of estimating the SOH of the power battery pack.

Corresponding to the above embodiment, this application further proposes an apparatus for calculating an SOH of a power battery pack.

Figure 4:
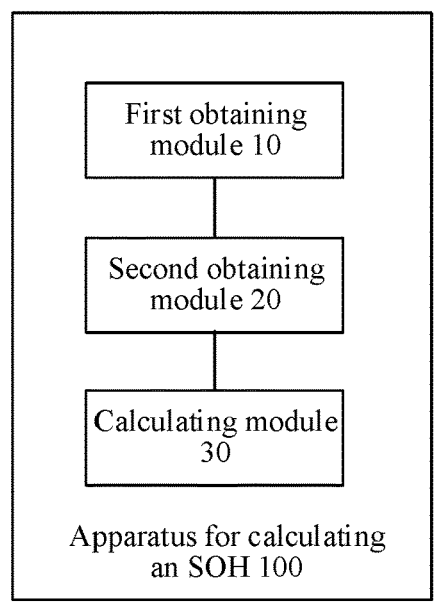
FIG. 4 is a schematic block diagram of an apparatus for calculating an SOH of a power battery pack according to an embodiment of this application.

As shown in FIG. 4, an apparatus 100 for calculating an SOH of a power battery pack in this embodiment of this application includes: a first obtaining module 10, a second obtaining module 20, and a calculating module 30.

The first obtaining module 10 is configured to obtain a charging curve of a cell of the power battery pack, and determine a current charging stage according to the charging curve, where the charging stage includes a high-voltage charging turning point and a high-voltage platform charging stage. The second obtaining module 20 is configured to obtain a battery pack level corresponding to the high-voltage charging turning point and a battery pack level corresponding to the high-voltage platform charging stage. The calculating module 30 is configured to calculate a remaining capacity of the cell according to the battery pack level corresponding to the high-voltage charging turning point and the battery pack level corresponding to the high-voltage platform charging stage and calculate an SOH of the cell according to the remaining capacity.

In an embodiment of this application, the power battery pack may be a lithium-ion battery. An initial SOC of the power battery pack is less than 20%, for example, 5%. A charging mode of the power battery pack may be a constant current charging mode, and a charging rate is less than 1 C. During charging of the power battery pack under the above conditions, the first obtaining module 10 in the BMS may collect and record parameters such as a total voltage and a total current of the power battery pack, a voltage and a temperature of a cell, and current charging duration, etc. A BMS charging algorithm may be enabled to obtain a charging curve of each cell in the power battery pack, that is, a relationship curve between a voltage V and a capacity Ah.

The first obtaining module 10 is specifically configured to perform smooth filtering on the charging curve, obtain a voltage of the cell, determining whether a change rate of the voltage of the cell between adjacent moments is a peak value exceeding a preset threshold, and when determining that the change rate of the voltage of the cell between the adjacent moments is the peak value, use, as the high-voltage charging turning point of the cell, a point corresponding to the change rate of the voltage as the peak value.

It may be understood that the first obtaining module 10 may calculate the charging curve of the cell to obtain a voltage change rate between a next moment and a previous moment, thereby facilitating determining. In an embodiment of this application, an initial stage of the charging curve may be referred to as a low-voltage platform charging stage. When the BMS charging algorithm detects a last curve turning point whose peak value is positive, the turning point is referred to as a low-voltage charging turning point $V_{LVTP}$, and then a middle-voltage platform (MVP) charging stage is enabled. When the change rate of the voltage of the cell between the adjacent moments is the peak value exceeding the preset threshold, the charging stage reaches the high-voltage charging turning point $V_{HVTP}$, and then enters the high-voltage platform (HVP) charging stage. In an embodiment of this application, a charging curve of a specific cell may be shown in FIG. 2, and a derivative curve thereof may be shown in FIG. 3.

In an embodiment of this application, the first obtaining module 10 may further determine, according to an SOC and the voltage of the cell, whether the high-voltage charging turning point is reached. If the change rate of the voltage of the cell between the adjacent moments is the peak value exceeding the preset threshold, and the SOC of the cell is less than a preset SOC value and/or the voltage of the cell is less than a preset voltage value, the point is used as the high-voltage charging turning point of the cell.

The calculating module 30 may calculate the remaining capacity of the cell according to the following formula:

$$Q' = Q_{HVTP} + Q_{HVP}, \text{ where}$$

$Q_{HVTP}$ is the battery pack level corresponding to the high-voltage charging turning point, and $Q_{HVP}$ is the battery pack level corresponding to the high-voltage platform charging stage.

In order to eliminate random errors, that is, battery level estimation errors caused by random reasons such as a temperature error, a current error, or a system algorithm error, etc., the calculating module 30 may obtain n previous calculated remaining capacities of the cell, and obtains a final remaining capacity of the cell according to the n calculated remaining capacities of the cell, and calculates the SOH of the cell according to the final remaining capacity.

The calculating module 30 may calculate the final remaining capacity of the cell according to the following formula:

$$Q_N = n_1 Q' + n_2 Q'' + \ldots + n_n Q^{n'}, \text{ where}$$

$Q_N$ is the final remaining capacity of the cell; and $n_1$-$n_n$ are weight parameters corresponding to the n calculated remaining capacities of the cell, and $Q'$-$Q'''$ are the n calculated remaining capacities of the cell, where $n_1+n_2+\ldots+n_n=1$. Specific values of $n_1$-$n_n$ may be assigned in combination with historical data and a current operating condition of the power battery pack.

After the final remaining capacity $Q_N$ of the cell is calculated, the calculating module 30 may calculate the SOH of the cell according to the following formula:

$$SOH = \frac{Q_N}{Q_0} * 100\%,$$

where $Q_0$ is an ex-factory nominal capacity of the cell.

Since the power battery pack is composed of cells, obtaining the SOH of the cell means obtaining the SOH of the power battery pack.

According to the apparatus for calculating an SOH of a power battery pack according to this embodiment of this application, the first obtaining module obtains the charging curve of the cell of the power battery pack and determines the current charging stage, the second obtaining module obtains the battery pack level corresponding to the high-voltage charging turning point and the battery pack level corresponding to the high-voltage platform charging stage, and the calculating module calculates the remaining capacity of the cell according to the battery pack level corresponding to the high-voltage charging turning point and the battery pack level corresponding to the high-voltage platform charging stage, and calculates the SOH of the cell according to the remaining capacity. Therefore, the apparatus does not require a cycle of full charging and full discharging, is free of impact of operating conditions of an electric vehicle, does not depend on an initial value of an SOC, and avoids accumulative errors caused by integrals, thereby greatly improving the convenience and the accuracy of estimating the SOH of the power battery pack.

Corresponding to the above embodiment, this application further proposes an electric vehicle.

Figure 5:
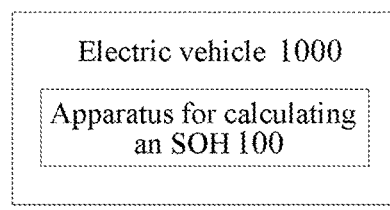
FIG. 5 is a schematic block diagram of an electric vehicle according to an embodiment of this application.

As shown in FIG. 5, an electric vehicle 1000 in this embodiment of this application includes the apparatus 100 for calculating an SOH of a power battery pack according to the above embodiment of this application. For a specific implementation of the apparatus, refer to the above embodiment. In order to avoid redundancy, details are not described herein again.

According to the electric vehicle of this embodiment of this application, convenience and accuracy of estimating the SOH of the power battery pack can be greatly improved.

In the description of this application, it should be understood that orientation or position relationships indicated by the terms such as, "center", "longitudinal", "transverse", "length", "width", "thickness", "on", "below", "front", "back", "left", "right", "vertical", "horizontal", "top", "bottom", "inside", "outside", "clockwise", "anticlockwise", "axial direction", "radial direction", and "circumferential direction" are based on orientation or position relationships shown in the accompanying drawings, and are used only for ease and brevity of illustration and description, rather than indicating or implying that the mentioned apparatus or component needs to have a particular orientation or needs to be constructed and operated in a particular orientation. Therefore, such terms should not be construed as limiting of this application.

In addition, the terms "first" and "second" are merely intended for a purpose of description, and shall not be understood as an indication or implication of relative importance or implicit indication of a quantity of indicated technical features. Therefore, a feature limited by "first" or "second" may explicitly or implicitly include one or more of the features. In the descriptions of this application, "a plurality of" means two or more, unless otherwise definitely and specifically limited.

In the description of this application, unless otherwise explicitly specified or defined, the terms such as "mount", "install", "connect", and "connection" should be understood in a broad sense. For example, the connection may be a fixed connection, a detachable connection, or an integral connection; or the connection may be a mechanical connection or an electrical connection; or the connection may be a direct connection, an indirect connection through an intermediary, or internal communication between two components. Persons of ordinary skill in the art may understand the specific meanings of the foregoing terms in this application according to specific situations.

In this application, unless otherwise explicitly specified or defined, the first feature being located "above" or "below" the second feature may be the first feature being in a direct contact with the second feature, or the first feature being in an indirect contact with the second feature through an intermediary. Moreover, the first feature is "over", "above", and "on" the second feature may mean that the first feature is directly above or obliquely above the second feature, or simply means that the first feature has a higher horizontal height than the second feature. That the first feature is "below", "under", and "beneath" the second feature may be that the first feature is right below the second feature or at an inclined bottom of the second feature, or may merely indicate that the horizontal height of the first feature is lower than that of the second feature.

In description of this specification, description of reference terms such as "one embodiment", "some embodiments", "example", "specific example" or "some examples" means including specific features, structures, materials, or features described in the embodiment or example in at least one embodiment or example of this application. In the specification, schematic descriptions of the foregoing terms do not need to be specific to a same embodiment or example. Besides, the specific features, structures, materials or characteristics that are described may be properly combined in any one or more embodiments or examples. In addition, a person skilled in the art may integrate or combine different embodiments or examples described in the specification and features of the different embodiments or examples as long as they are not contradictory to each other.

Although the embodiments of this application are shown and described above, it can be understood that, the foregoing embodiments are exemplary, and cannot be construed as a limitation to this application. Within the scope of this application, a person of ordinary skill in the art may make changes, modifications, replacement, and variations to the foregoing embodiments.

What is claimed is:

1. A method for calculating a state of health (SOH) of a power battery pack, comprising the following steps:

obtaining a charging curve of a cell of the power battery pack, and determining a current charging stage according to the charging curve, wherein the charging stage comprises a high-voltage charging turning point and a high-voltage platform charging stage;

obtaining a battery pack level corresponding to the high-voltage charging turning point and a battery pack level corresponding to the high-voltage platform charging stage;

calculating a remaining capacity of the cell according to the battery pack level corresponding to the high-voltage charging turning point and the battery pack level corresponding to the high-voltage platform charging stage; and calculating an SOH of the cell according to the remaining capacity.

2. The method for calculating an SOH of a power battery pack according to claim 1, wherein the determining a current charging stage according to the charging curve comprises:

performing smooth filtering on the charging curve, and obtaining a voltage of the cell;

determining whether a change rate of the voltage of the cell between adjacent moments is a peak value exceeding a preset threshold; and when the change rate of the voltage of the cell between the adjacent moments is the peak value exceeding the preset threshold, using, as the high-voltage charging turning point of the cell, a point corresponding to the change rate of the voltage as the peak value.

3. The method for calculating an SOH of a power battery pack according to claim 1, wherein the remaining capacity of the cell is calculated according to the following formula:

$$Q' = Q_{HVTP} + Q_{HVP},$$

wherein $Q_{HVTP}$ is a battery pack level corresponding to the high-voltage charging turning point, and $Q_{HVP}$ is a battery pack level corresponding to the high-voltage platform charging stage.

4. The method for calculating an SOH of a power battery pack according to claim 1, wherein the calculating an SOH of the cell according to the remaining capacity comprises:

obtaining n calculated remaining capacities of the cell;

calculating a final remaining capacity of the cell according to the n calculated remaining capacities of the cell; and calculating the SOH of the cell according to the final remaining capacity.

5. The method for calculating an SOH of a power battery pack according to claim 4, wherein the final remaining capacity of the cell is calculated according to the following formula:

$$Q_N = n_1 Q' + n_2 Q'' + \ldots + n_n Q''',$$

wherein $Q_N$ is the final remaining capacity of the cell; and $n_1$-$n_n$ are weight parameters corresponding to the n calculated remaining capacities of the cell, and $Q'$-$Q'''$ are the n calculated remaining capacities of the cell, wherein $n_1 + n_2 + L + n_n = 1$.

6. The method for calculating an SOH of a power battery pack according to claim 5, wherein the SOH of the cell is calculated according to the following formula:

$$SOH = \frac{Q_N}{Q_0} * 100\%,$$

wherein $Q_0$ is an ex-factory nominal capacity of the cell.

7. An apparatus for calculating a state of health (SOH) of a power battery pack, comprising:

a first obtaining module configured to obtain a charging curve of a cell of the power battery pack, and determine a current charging stage according to the charging curve, wherein the charging stage comprises a high-voltage charging turning point and a high-voltage platform charging stage;

a second obtaining module configured to obtain a battery pack level corresponding to the high-voltage charging turning point and a battery pack level corresponding to the high-voltage platform charging stage; and a calculating module configured to calculate a remaining capacity of the cell according to the battery pack level corresponding to the high-voltage charging turning point and the battery pack level corresponding to the high-voltage platform charging stage, and calculate the SOH of the cell according to the remaining capacity.

8. The apparatus for calculating an SOH of a power battery pack according to claim 7, wherein the first obtaining module is configured to:

perform smooth filtering on the charging curve, obtain a voltage of the cell; and when determining that a change rate of the voltage of the cell between adjacent moments is a peak value exceeding a preset threshold, use, as the high-voltage charging turning point of the cell, a point corresponding to the change rate of the voltage as the peak value.

9. The apparatus for calculating an SOH of a power battery pack according to claim 7, wherein the calculating module calculates the remaining capacity of the cell according to the following formula:

$$Q' = Q_{HVTP} + Q_{HVP},$$

wherein $Q_{HVTP}$ is a battery pack level corresponding to the high-voltage charging turning point, and $Q_{HVP}$ is a battery pack level corresponding to the high-voltage platform charging stage.

10. The apparatus for calculating an SOH of a power battery pack according to claim 7, wherein the calculating module is configured to obtain n calculated remaining capacities of the cell, calculate a final remaining capacity of the cell according to the n calculated remaining capacities of the cell, and calculate the SOH of the cell according to the final remaining capacity.

11. The apparatus for calculating an SOH of a power battery pack according to claim 10, wherein the calculating module calculates the final remaining capacity of the cell according to the following formula:

$$Q_N = n_1 Q' + n_2 Q'' + \ldots + n_n Q''',$$

wherein $Q_N$ is the final remaining capacity of the cell; and $n_1$-$n_n$ are weight parameters corresponding to the n calculated remaining capacities of the cell, and $Q'$-$Q'''$ are the n calculated remaining capacities of the cell, wherein $n_1 + n_2 + L + n_n = 1$.

12. The apparatus for calculating an SOH of a power battery pack according to claim 11, wherein the calculating module calculates the SOH of the cell according to the following formula:

$$SOH = \frac{Q_N}{Q_0} * 100\%,$$

wherein $Q_0$ is an ex-factory nominal capacity of the cell.

* * * * *